(12) United States Patent
Nam

(10) Patent No.: US 8,796,921 B2
(45) Date of Patent: Aug. 5, 2014

(54) FLEXIBLE DISPLAY PANEL

(71) Applicant: Samsung Display Co., Ltd., Yongin (KR)

(72) Inventor: Wi-Jin Nam, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/758,042

(22) Filed: Feb. 4, 2013

(65) Prior Publication Data

US 2014/0098471 A1  Apr. 10, 2014

(30) Foreign Application Priority Data

Oct. 9, 2012 (KR) .................. 10-2012-0112095

(51) Int. Cl.
*H01J 1/62* (2006.01)
*H01J 63/04* (2006.01)

(52) U.S. Cl.
USPC ........... 313/512; 313/483; 313/510; 313/511; 313/505; 313/506; 313/503; 313/504

(58) Field of Classification Search
None
See application file for complete search history.

(56) References Cited

U.S. PATENT DOCUMENTS

| 7,781,966 B2* | 8/2010 | Nam ........................ 313/512 |
| 8,072,437 B2 | 12/2011 | Miller et al. |
| 2011/0241013 A1 | 10/2011 | An et al. |

FOREIGN PATENT DOCUMENTS

| JP | 2002-297066 A | 10/2002 |
| KR | 10-2008-0015668 A | 2/2008 |
| KR | 10-2011-0109560 A | 10/2011 |
| KR | 10-2012-0058540 A | 6/2012 |

* cited by examiner

*Primary Examiner* — Natalie Walford
(74) *Attorney, Agent, or Firm* — Robert E. Bushnell, Esq.

(57) ABSTRACT

A flexible display panel including: a flexible substrate comprising a first area and a second area, wherein the first area is formed in a first direction, and the second area is formed in a second direction that is different from the first direction; a first display area formed on the first area of the flexible substrate; a second display area formed on the second area of the flexible substrate; a bending area formed between the first display area and the second display area; and an encapsulation substrate encapsulating at least the first display area and the second display area. Accordingly, as a display area is not formed in a bent portion, display defects due to bending may be prevented.

17 Claims, 3 Drawing Sheets

FLEXIBLE DISPLAY PANEL

CLAIM OF PRIORITY

This application makes reference to, incorporates the same herein, and claims all benefits accruing under 35 U.S.C. §119 from an application earlier filed in the Korean Intellectual Property Office on the 9$^{th}$ of Oct. 2012 and there duly assigned Serial No. 10-2012-0112095.

BACKGROUND OF THE INVENTION

1. Field of the Invention

The present invention relates to a flexible display panel, and more particularly, to a flexible display panel in which defects due to bending are prevented.

2. Description of the Related Art

A display panel is an apparatus for displaying an image signal. A display panel refers to any apparatus that displays an image signal input from the outside, such as a digital camera, a smart phone, a laptop computer, a tablet personal computer, a camcorder, and a video camera, including any device that displays an image signal input from the outside.

Flexible display panels that can be carried easily and that can be applied to various types of devices have been recently studied and developed for next generation display devices. Flexible display panels based on an organic light-emitting display technology are the most powerful next generation display devices among display apparatuses.

A portion of a flexible display panel may be bent in one direction. If a display area for displaying an image is located in this bent portion, and cracks are generated, various defects and reliability problems may occur in the bent portion. For example, cracks may be generated in an encapsulation substrate that covers a display area, and this may cause deterioration in a material of an emissive layer and dark spot defects.

Meanwhile, various methods for allowing a user to view a screen not only from a top side of a display panel but also from a lateral side are being researched.

SUMMARY OF THE INVENTION

The present invention provides a flexible display panel in which defects due to bending are prevented and dead space is reduced.

According to an aspect of the present invention, there is provided a flexible display panel comprising: a flexible substrate comprising a first area and a second area, wherein the first area is formed on a first plane of the flexible display panel in a first direction, and the second area is formed on a second plane of the flexible display panel in a second direction that is different from the first direction; a first display area formed on the first area of the flexible substrate; a second display area formed on the second area of the flexible substrate; a bending area formed between the first display area and the second display area; and an encapsulation substrate encapsulating at least the first display area and the second display area.

The bending area may be bent from the first area to the second area.

A scan line of the scan driving unit may be formed across the first display area and across the emission driving unit so as to be electrically connected to a plurality of second display areas.

An emission line of the emission driving unit may be formed across the first display area and across the scan driving unit so as to be electrically connected to a plurality of second display areas.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
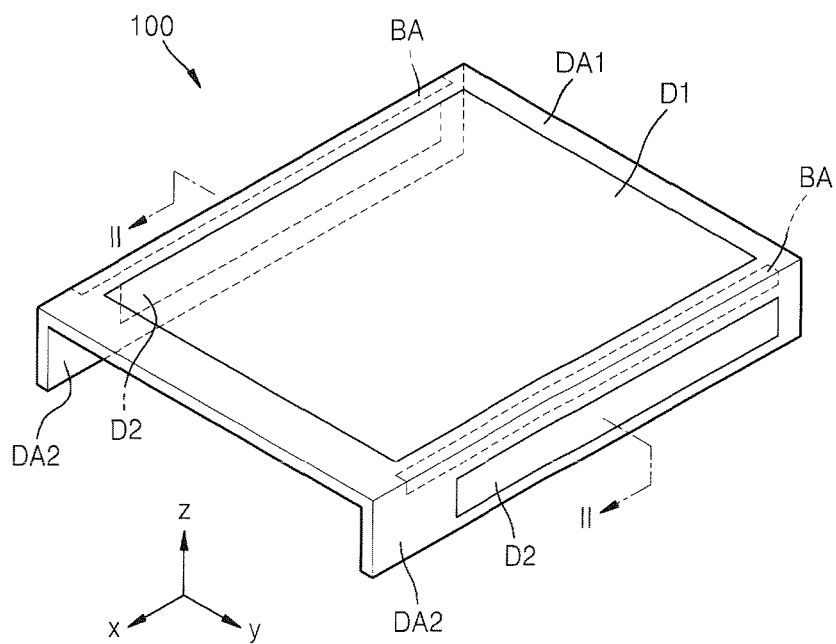
FIG. 1 is a perspective view illustrating a flexible display panel according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A flexible display device according to an embodiment of the present invention will be described below in more detail with reference to the accompanying drawings. Those components that are the same or are in correspondence are rendered the same reference numeral regardless of the figure number, and redundant explanations are omitted.

Figure 2:
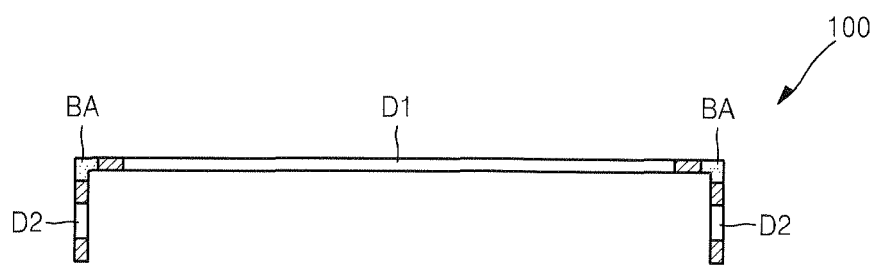
FIG. 2 is a cross-sectional view of the flexible display panel of FIG. 1 cut along a line II-II, according to an embodiment of the present invention.

FIG. 1 is a perspective view illustrating a flexible display panel 100 according to an embodiment of the present invention. FIG. 2 is a cross-sectional view of the flexible display panel 100 of FIG. 1 cut along a line II-II, according to an embodiment of the present invention.

Referring to FIGS. 1 and 2, the flexible display panel 100 includes a first area DA1 and a second area DA2.

The first area DA1 is formed on a first plane x-y of the flexible display panel 100. A first display area D1 is formed on the first area DA1. The first display area D1 is substantially planar, and forms a main display screen of the flexible display panel 100.

The second area DA2 is disposed along a direction that is different from a direction in which the first area DA1 is formed. The second area DA2 is formed on a second plane x-z, which is in a direction perpendicular to the first plane x-y of the flexible display panel 100.

According to the current embodiment of the present invention, the second area DA2 is extended along two sides of the first area DA1 along a Y-direction of the flexible display panel 100 and a bend occurs between the second area DA2 and the first area DA1 in a -Z direction that is perpendicular to the Y-direction.

The second display area D2 is formed on the second area DA2. That is, the second display area D2 is formed on lateral sides of the flexible display panel 100, forming sub-display screens.

According to the current embodiment of the present invention, the second area DA2 is formed on two lateral sides of the first area DA1 along a Y-direction, and a bend occurs between the second area DA2 and the first area DA1 along a -Z direction of FIG. 1. However, a direction in which the bend occurs or the number of the second areas DA2 are not limited as long as the bend occurs in at least one direction from the plane where the first area DA1 is formed so that light may be emitted both from the top side and the lateral side of the flexible display panel 100.

A bending area BA is formed between the first display area D1 and the second display area D2. The bending area BA is formed in a position corresponding to a portion of the flexible display panel 100 that is bent along the X-axis between the first area DA1 and the second area DA2 in the -Z direction. According to the current embodiment of the present invention, the bending area BA is bent at a right angle with respect to the direction in which the first area DA1 is formed.

As described above, in the flexible display panel 100, top emission is generated through the first display area D1 formed on the first area DA1, and edge-lit emission is generated from the second display area D2 formed on the second area DA2. However, the first display area D1 and the second display area D2 are not included in the bending area BA.

Figure 3:
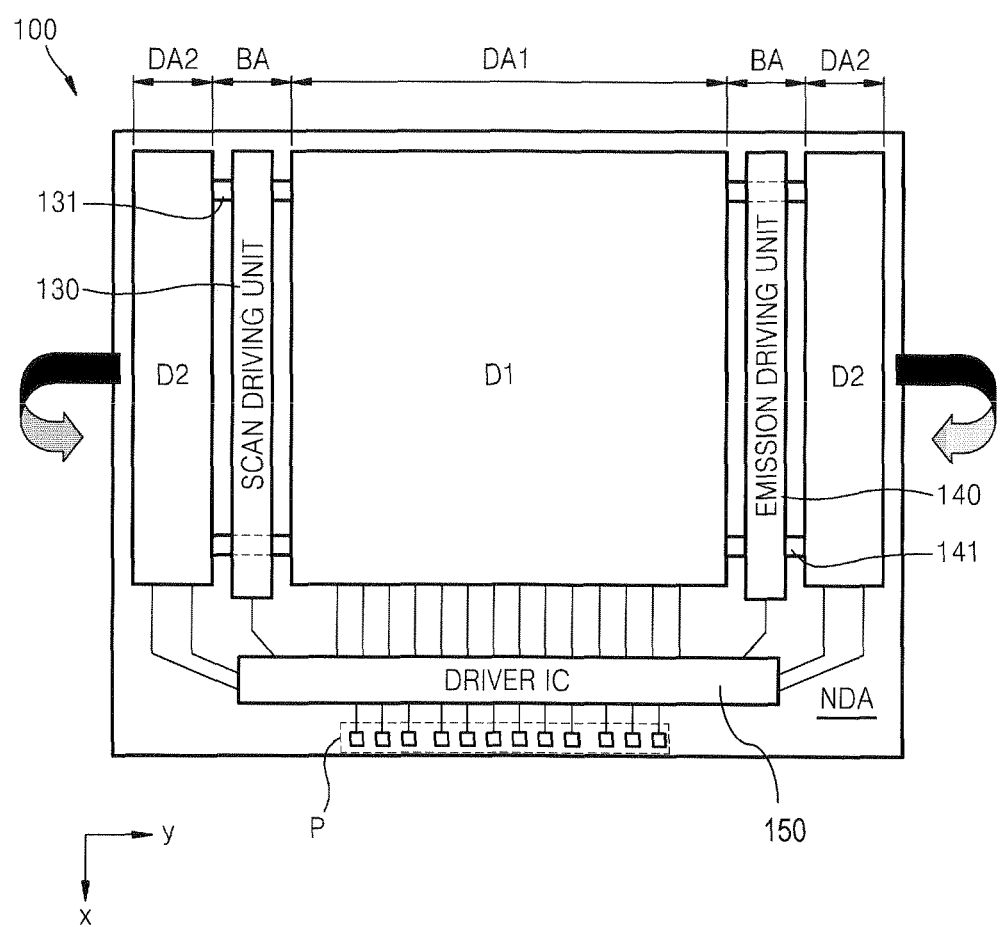
FIG. 3 is a plan view illustrating the flexible display panel of FIG. 1 before being bent.
Figure 4:
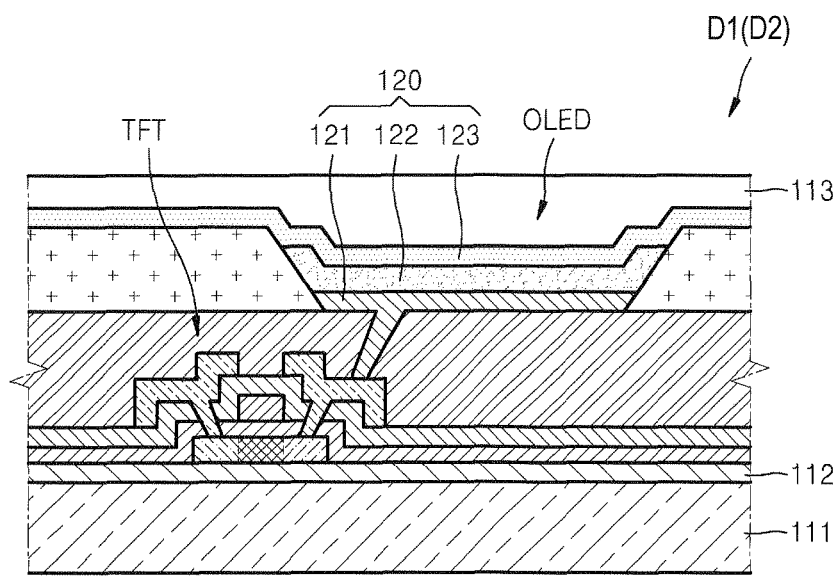
FIG. 4 is a cross-sectional view of a display area illustrated in FIG. 1 according to an embodiment of the present invention.

FIG. 3 is a plan view illustrating the flexible display panel 100 of FIG. 1 before being bent. FIG. 4 is a cross-sectional view of either the display area D1 or the second display area D2 illustrated in FIG. 1 according to an embodiment of the present invention.

Referring to FIG. 3, a third area NDA is further formed on a flexible substrate 111 (FIG. 4) outside the first area DA1 along an X-direction of the flexible substrate 111. A pad unit P is formed in the third area NDA. A driver IC mounting region 150 may be coupled to pad unit P for coupling signal lines and/or power lines, formed on the barrier layer 112 or the flexible substrate 111, to an IC.

The second areas DA2 is formed at two sides of the first area DA1, and the bending areas BA is formed at the two sides of the first area DA1 in an area between the first area DA1 and the second areas DA2.

At least one driving circuit unit is formed in the bending area BA.

According to the current embodiment of the present invention, the driving circuit unit includes a scan driving unit 130 and an emission driving unit 140. The scan driving unit 130 generates and transmits a scan signal to each of a plurality of pixels via a plurality of scan lines 131. The emission driving unit 140 generates and transmits an emission control signal to each of the plurality of pixels via a plurality of emission lines 141.

As shown in FIG. 3, the scan driving unit 130 is formed in the bending area BA between the first area DA1 and the second area DA2 on the left side, and the emission driving unit 140 is formed in the bending area BA between the first area DA1 and the second area DA2 on the right side.

The plurality of scan lines 131 that are drawn out of the scan driving unit 130 are formed so as to transfer an electrical signal to the second display area D2 formed on the left side of the first display area D1, and are formed across the emission driving unit 140 so as to transfer an electrical signal to the second display area D2 formed on the right side of the first display D1.

The plurality of emission lines 141 that are drawn out of the emission driving unit 140 are formed so as to transfer an electrical signal to the second display area D2 formed on the right side of the first display area D1, and are formed across the scan driving unit 130 so as to transfer an electrical signal to the second display area D2 formed on the left side of the first display area D1.

While not shown in FIG. 3, the driving circuit unit further includes, in addition to the scan driving unit 130 and the emission driving unit 140, a data driving unit, a control unit, and a power supply unit. The data driving unit transmits a data signal to each of the plurality of pixels via a plurality of data lines. A control unit converts a plurality of image signals (R, G, and B) that are transmitted from the outside, to a plurality of image data signals and transmits the same to the data driving unit. The power supply unit supplies an external power to the flexible display panel 100.

According to the current embodiment of the present invention, while the driving circuit unit formed in the bending area BA is described as including the scan driving unit 130 and the emission driving unit 140, the data driving unit, the control unit, and the power supply unit may also be formed in the bending area BA. Also, both the scan driving unit 130 and the emission driving unit 140 may be formed in at least in one of the bending areas BA.

According to the current embodiment of the present invention, the first display area D1 and the second display area D2 receive an image signal from the driving circuit unit including the scan driving unit 130 and the emission driving unit 140. That is, the first display area D1 and the second display area D2 display an image transmitted via a common image signal input unit. Accordingly, the first display area D1 and the second display area D2 together function as a single display screen.

However, the embodiment of the present invention is not limited thereto, and the first display area D1 and the second display area D2 may display an image that is input via different image signal input units.

According to the current embodiment of the present invention, an organic light-emitting device in FIG. 4 will be described as an example. Referring to FIG. 4, the flexible display panel 100 includes a flexible substrate 111 including thin film layers, a barrier layer 112 formed on the flexible substrate 111, and a first display area D1 and a second display area D2 formed on the barrier layer 112, and an encapsulation substrate 113.

The flexible substrate 111 may be formed of a flexible material such as a polymer material, for example, a plastic film. The flexible substrate 111 includes a polymer material such as polyimide (PI), polycarbonate (PC), polyethersulphone (PES), polyethylene terephthalate (PET), polyethylenenaphthalate (PEN), polyarylate (PAR), and fiber glass reinforced plastic (FRP).

The barrier layer 112 is formed on the flexible substrate 111. The barrier layer 112 may be formed of an inorganic layer such as silicon oxide (SiOx), silicon nitride (SiNx), silicon oxynitride (SiON), aluminum oxide (AlO), or aluminum oxynitride (AlON), or an organic layer such as acryl or polyimide, or may be formed by alternately stacking an organic layer and an inorganic layer. The barrier layer 112 prevents penetration of oxygen or water into the first display area D1 and the second display area D2 through the flexible substrate 111.

The first display area D1 and the second display area D2 are formed on the barrier layer 111.

The display area D1 is where an image signal is displayed, and may be a main display screen. Various display devices such as an organic light-emitting display device, a liquid crystal display device, and an electrophoresis device may be formed in the first display area D1.

According to the current embodiment of the present invention, an organic light-emitting device 120 will be described as an example. Additionally, various devices such as a thin film transistor and a capacitor for driving the display devices may also be formed in the first display area D1.

The second display area D2 is formed at two sides of the display area D1, that is, on lateral side portions of the flexible display panel 100, and is an area where an image signal is displayed, or, a sub-display screen. Like the first display area D1, various display devices such as an organic light-emitting display device, a liquid crystal display device, and an electrophoresis device may be formed in the second display area D2.

In addition, various devices such as a thin film transistor and a capacitor for driving the display devices may be formed in the second display area D2.

The organic light-emitting device 120 includes a pixel electrode 121, an opposite electrode 123, which is a common layer of the organic light-emitting device 120, and an organic emissive layer 122 interposed between the pixel electrode 121 and the opposite electrode 123. While not shown in FIG. 4, the organic light-emitting device 120 is electrically connected to at least one switching thin film transistor and at least one storage capacitor so that light is emitted from the first display area D1 or the second display area D2.

Light emitted from the organic emissive layer 122 formed in the first display area D1 may be emitted toward the flexible substrate 111 or toward the encapsulation substrate 113. According to the current embodiment of the present invention, a top emissive type display device in which an image is formed toward the encapsulation substrate 113 will be described. However, the embodiments of the present invention are not limited thereto, and a bottom emission type display device in which an image is formed toward the flexible substrate 111 may also be used in the embodiments of the present invention.

Light emitted from the organic emissive layer 122 formed in the second display area D2 may be emitted through the lateral sides of the flexible display panel 100 and out of the second display area D2.

The encapsulation substrate 113 is bonded on the organic light emitting device 120. The encapsulation substrate 113 may preferably be formed of substantially the same material as that of the flexible substrate 111. The encapsulation substrate 113 is a flexible encapsulation thin film which is easily bendable. Alternatively, the encapsulation substrate 113 may encapsulate the organic light emitting device 120 by forming an organic layer and/or an inorganic film on the encapsulation substrate 113 after manufacturing the organic light-emitting device 120.

Meanwhile, although not illustrated in the drawings, a touch screen may be further formed on the encapsulation substrate 113. The touch screen may be an on-cell touch screen panel (TSP) which is a touch screen pattern formed on the encapsulation substrate 113. The touch screen may be formed on the encapsulation substrate as a single unit with the encapsulation substrate.

The touch screen described above is of an electrostatic capacitive type, but one of touch screens of a resistive type, an electro-magnetic type, a saw type, and an infrared type may also be used.

A planarization plate may be further formed on the touch screen. The planarization plate prevents reflection of external light from the flexible display panel 100.

A window cover may be further provided on the planarization plate.

Figure 5:
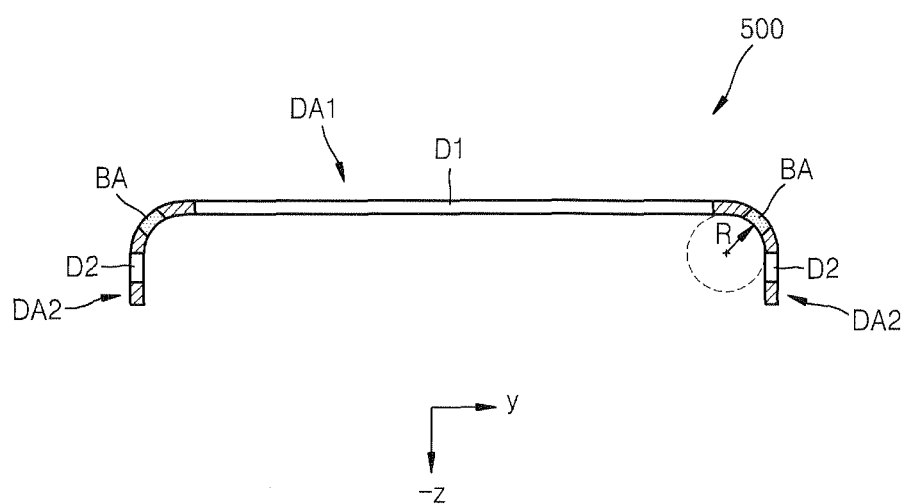
FIG. 5 is a cross-sectional view illustrating a flexible display panel according to another embodiment of the present invention.

FIG. 5 is a cross-sectional view illustrating a flexible display panel 500 according to another embodiment of the present invention.

Referring to FIG. 5, the flexible display panel 500 includes a first area DA1 and second areas DA2.

A first display area D1 for top emission is formed on the first area DA1 as a main display screen of the flexible display panel 500. A second display area D2 for edge-lit emission is formed on the second area DA2 as a sub-display screen of the flexible display panel 500. A bend in the flexible display panel 500 occurs between the second area DA2 and the first area DA1 in a -Z direction from a plane in which the first area DA1 is formed.

A bending area BA is formed between the first display area D1 and the second display area D2. The bending area BA is an area that is bent and is between the first area DA1 and the second area DA2 in the -Z direction of the flexible display panel 500.

According to the current embodiment of the present invention, the bending area BA is bent at an acute angle with respect to a -Z direction from a plane in which the first area DA1 is formed. That is, an angle formed by the first area DA1, the bending area BA, and the second area DA2 is greater than 0° with respect to the -Z direction from the plane in which the first area DA1 is formed, and may preferably have a curvature radius of 90° or less.

As the bending area BA has a predetermined curvature radius, a display screen of the flexible display panel 500 is not limited to the first display area D1 but is extended to the second display area D2, thereby increasing the total display screen.

Also, when the flexible display panel 500 is used in a display panel that is small enough to be held in the hand like a smart phone, a curvature is formed in the bending area BA, thereby improving grip thereof and aesthetic qualities.

As described above, according to the flexible display panel of the embodiments of the present invention, the following effects may be obtained.

First, as a display area is not formed in a bent portion, display defects due to the bending may be prevented.

Second, as a driving circuit unit is formed in the bending area, dead space on edges of a display panel is reduced. Accordingly, a slim display panel may be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible display panel comprising:
   a flexible substrate comprising a first area and a second area, wherein the first area is formed on a first plane of the flexible display panel in a first direction, and the second area is formed on a second plane of the flexible display panel in a second direction that is different from the first direction;
   a first display area formed on the first area of the flexible substrate;
   a second display area formed on the second area of the flexible substrate;
   a barrier layer formed between the flexible substrate and the first display area and the second display area;
   a bending area formed between the first display area and the second display area; and
   an encapsulation substrate encapsulating at least the first display area and the second display area.

2. The flexible display panel of claim 1, wherein the bending area is bent from the first area to the second area.

3. The flexible display panel of claim 1, wherein a driving circuit unit is formed in the bending area.

4. The flexible display panel of claim 1, wherein the bending area is bent at a right angle with respect to the first direction in which the first area is formed.

5. The flexible display panel of claim 1, wherein the bending area is bent at an acute angle with respect to the first direction in which the first area is formed.

6. The flexible display panel of claim 1, wherein the first display area and the second display area display an image that is input via a common image signal input unit.

7. The flexible display panel of claim 1, wherein the first display area and the second display area display an image that is input via different image signal input units.

8. The flexible display panel of claim 1, wherein the first display area and the second display area each include at least one organic light emitting device.

9. The flexible display panel of claim 1, wherein the encapsulation substrate is a flexible encapsulation thin film.

10. The flexible display panel of claim 1, wherein the first area and the second area are respectively continuously formed on the flexible substrate in the first and second directions, and the bending area is bent in a direction that is different from the first direction in which the first area is formed.

11. The flexible display panel of claim 10, wherein the flexible substrate further comprises a third area that is formed outside the first area along the first direction of the flexible substrate.

12. The flexible display panel of claim 11, wherein a pad unit is formed in the third area.

13. The flexible display panel of claim 1, wherein the second area is formed at two lateral sides of the first area, and the bending area is a portion of the flexible display panel that is bent between the first area and the second area.

14. The flexible display panel of claim 13, wherein a driving circuit unit is formed in the bending area.

15. The flexible display panel of claim 14, wherein the driving circuit unit comprises a scan driving unit and an emission driving unit, and the scan driving unit and the emission driving unit are formed at two sides of the first area.

16. The flexible display panel of claim 15, wherein a scan line of the scan driving unit is formed across the first display area and the emission driving unit so as to be electrically connected to a plurality of second display areas.

17. The flexible display panel of claim 15, wherein an emission line of the emission driving unit is formed across the first display area and the scan driving unit so as to be electrically connected to a plurality of second display areas.

* * * * *